United States Patent
Isobe et al.

(10) Patent No.: US 7,303,927 B2
(45) Date of Patent: Dec. 4, 2007

(54) THREE-DIMENSIONAL FERROELECTRIC CAPACITOR AND METHOD FOR MANUFACTURING THEREOF AS WELL AS SEMICONDUCTOR MEMORY DEVICE

(75) Inventors: Chiharu Isobe, Tokyo (JP); Yoshio Sakai, Kanagawa (JP)

(73) Assignee: Sony Corporation, Tokyo (JP)

( * ) Notice: Subject to any disclaimer, the term of this patent is extended or adjusted under 35 U.S.C. 154(b) by 273 days.

(21) Appl. No.: 10/834,547

(22) Filed: Apr. 29, 2004

(65) Prior Publication Data
US 2004/0266096 A1    Dec. 30, 2004

(30) Foreign Application Priority Data
May 6, 2003    (JP)    ............ P2003-128184

(51) Int. Cl.
H01L 21/20    (2006.01)
(52) U.S. Cl. .......................... 438/3; 438/398
(58) Field of Classification Search ............ 438/3, 438/398
See application file for complete search history.

(56) References Cited
U.S. PATENT DOCUMENTS 6,333,225 B1 * 12/2001 Schuegraf et al. .......... 438/253
6,518,612 B2 * 2/2003 Lee et al. .................. 257/296
6,635,561 B2 * 10/2003 Kawai et al. ............... 438/622
2001/0051381 A1 * 12/2001 Yang et al. .................. 438/3

FOREIGN PATENT DOCUMENTS

| JP | 10-242411 | 9/1998 |
|---|---|---|
| JP | 11-195678 | 7/1999 |
| JP | 11-354742 | 12/1999 |
| JP | 2001-053250 | 2/2001 |
| JP | 2002-057297 | 2/2002 |
| JP | 2002-198495 | 7/2002 |
| JP | 2003-068989 | 3/2003 |
| JP | 2003-086776 | 3/2003 |

* cited by examiner

Primary Examiner—Zandra V. Smith
Assistant Examiner—Pamela E Perkins
(74) Attorney, Agent, or Firm—Sonnenschein Nath & Rosenthal LLP

(57) ABSTRACT

A ferroelectric capacitor is provided in which the surface area of a ferroelectric thin film is expanded to increase the amount of polarization. In the ferroelectric capacitor, hemispherical protruding parts 31 are formed with HSG-growth on the surface of a polycrystalline silicon film 30. On the polycrystalline silicon film 30 having the hemi-spherical protruding parts 31 are sequentially laminated an adhesive layer 32, lower electrode 33, ferroelectric film 34, and upper electrode 35. The ferroelectric film 34 is shaped to overlap the shape of hemi-spherical protruding parts 31 of the polycrystalline silicon film 30, and the surface area thereof is expanded.

8 Claims, 2 Drawing Sheets

THREE-DIMENSIONAL FERROELECTRIC CAPACITOR AND METHOD FOR MANUFACTURING THEREOF AS WELL AS SEMICONDUCTOR MEMORY DEVICE

RELATED APPLICATION DATA

The present application claims priority to Japanese Application(s) No(s). P2003-128184 filed May 6, 2003, which application(s) is/are incorporated herein by reference to the extent permitted by law.

BACKGROUND OF THE INVENTION

1. Field of the Invention

The present invention relates to a three-dimensional ferroelectric capacitor that is suitable for being applied to a non-volatile semiconductor memory, for example, FeRAM (Ferroelectric Random Access Memory) and a method for manufacturing thereof as well as a semiconductor memory device using the three-dimensional ferroelectric capacitor.

2. Description of the Related Art

A ferroelectric type non-volatile semiconductor memory is composed of a dielectric capacitor section and selective transistor section, and its memory function is to make use of a spontaneous electric polarization phenomenon inherent in a ferroelectric material of the dielectric capacitor section to store information by matching the two stable states of the spontaneous polarization to [1] or [2]. This spontaneous polarization can invert its direction according to an electric field from the outside to change [1] or [2] information, and since the spontaneous polarization remains intact even after the electric field from the outside is removed, it functions as memory to store information even after a power supply is suspended. This ferroelectric-type non-volatile semiconductor memory has been put into practical use because of its characteristics such as high-speed information rewriting, low power consumption, high integration, and an enormously large number of times in information rewriting ability.

In addressing the miniaturization of cell areas due to the demand for a large capacity of semiconductor memory of late, use of ferroelectric materials as a dielectric film, such as $SrTiO_3$ with high dielectric constants has been considered. However, the electric characteristics of these ferroelectric materials have been the cause of characteristic deterioration influenced by stress generated in an inter-layer dielectric film formed on the capacitor, compression stress occurring in a substrate, and tensile stress.

As a countermeasure, there are documents in which a three-dimensional semiconductor device is described to improve the structure of a semiconductor memory (for example, refer to Patent document 1). The semiconductor device described in patent document 1 has on a semiconductor substrate a dielectric capacitor including a column-structured first electrode, a dielectric film to cover the first electrode, and a second electrode to cover the first electrode and dielectric film, and is structured such that a non-electric conductor (low dielectric constant layer) is provided between the first electrode and dielectric film; and the semiconductor device operates effectively as a capacitor by sequentially laminating the dielectric film and second electrode on the side wall of the column-structured first electrode.

In addition, by providing the low dielectric constant layer between the first electrode and dielectric film, an electric field at the upper part of the lower electrode can be alleviated, so that an electric field in the dielectric capacitor can be focused on an approximately vertical direction to the sidewall of the lower electrode. Consequently, it becomes possible to prevent the electric field from locally focusing on the edge part of the lower electrode and, as a result, the reliability of the semiconductor memory is improved.

In the above-mentioned patent document 1, there is described a three-dimensional structure semiconductor memory in which the first electrode has a column-structure and the dielectric film and second electrode are laminated to cover the first electrode. In addition, even in the case where the dielectric film used in the dielectric capacitor uses a high dielectric film or ferroelectric film consisting of oxide or the like, in the document a semiconductor device is capable of restraining the characteristics deterioration of the dielectric film as occurs within the surface of the semiconductor substrate due to internal stress and an increase in a leak power current caused by the electric field focusing on the edge part of the lower electrode.

In the patent document 1 with respect to the three-dimensional structure semiconductor device, however, there is shown no intention or description of replenishing or increasing the declining amount of polarization in the ferroelectric film which may occur accompanied by miniaturization of the ferroelectric capacitor.

In addition, there is a description with respect to ferroelectric type non-volatile semiconductor memory cells of the planar type and stack type, in which a ferroelectric type non-volatile semiconductor memory cell is composed of a ferroelectric capacitor section and selective transistor element, and the ferroelectric capacitor section is composed of, for example, a lower electrode, upper electrode and ferroelectric layer held between these electrodes (for example, refer to Patent document 2).

[Patent document 1]
Japanese Laid-open Patent Application 2002-198495 (page 4 paragraphs [0011] to [0013], page 7 paragraph [0045])

[Patent document 2]
Japanese Laid-open Patent Application 2002-57297 (page 8 paragraph [0058] to page 9 paragraph [0065], page 9 paragraph [0068])

Conventionally, in order to improve the function of the ferroelectric capacitor (the amount of the electric charge of spontaneous polarization) of the ferroelectric type non-volatile semiconductor memory cell, it is important to form a film of the ferroelectric, in which crystallinity is excellent and the direction of crystallization (orientation) is aligned in a fixed direction. Of late, device elements tend to be miniaturized. As a result, capacity including spontaneous polarization per one element of the ferroelectric crystalline film that covers the lower electrode constituting the ferroelectric capacitor is reduced, so that the amount of the electric charge of spontaneous polarization of the ferroelectric capacitor tends to decrease.

The signal amounts of the ferroelectric capacitor of the ferroelectric type non-volatile semiconductor memory cell depend on the amount of polarization of the ferroelectric (SBT, PZT, BLT or the like) used. There are two measures to compensate for a decrease in the signal amounts due to miniaturization of 0.18 micrometer or less. One is to develop a technology for manufacturing a thin film crystal capable of forming homogeneous and microscopic grains in a microscopic capacitor while controlling the orientation of the ferroelectric thin film crystal. The other is to form a three-dimensional structure so as to expand the surface area of the capacitor in order to enlarge the limited area thereof.

The former measure is, however, strongly dependant on the property of respective ferroelectrics, so that it is difficult to control the orientation and to realize the miniaturization of grains as designed.

Therefore, the latter measure, in which the three-dimensional structure is formed without changing the material property of the respective ferroelectrics to expand the surface area so that the decrease in the amount of polarization due to miniaturization is compensated, is considered efficient.

As for the three-dimensional structure to expand the surface area of the ferroelectric capacitor, it is considered that a lower electrode and ferroelectric layer are laminated on a base structure that is etched to be processed into a rectangular solid to form a rectangular ferroelectric capacitor.

FIG. 1 is a conceptual diagram of a ferroelectric capacitor in which a three-dimensional structure of a rectangular solid is provided. The direction of crystallization of the upper surface (arrow mark A) and that of the side wall surface (arrow mark B) of the ferroelectric capacitor that is composed of a lower electrode 2 formed on an inter-layer dielectric layer 1 which is formed on a semiconductor substrate (not shown in the figure) and a ferroelectric crystalline film 3 formed on the lower electrode 2 are different in the direction of crystallization, that is, in orientation.

In addition, since the upper surface and sidewall surface each having a different orientation of crystallization collide with each other at a rectangular-shaped edge part 4, it is difficult to obtain continuous and homogeneous crystal, and a void tends to easily occur at this edge part, resulting in a crystallization defect. As mentioned so far, the ferroelectric crystalline film 3 having a three-dimensional structure is efficiently used in the case where the amount of the electric charge of the spontaneous polarization is increased by enlarging capacity, that is, expanding the surface area of the ferroelectric layer. However, there is a defect in the rectangular solid structure shown in FIG. 1.

The present invention was made in view of the above-mentioned circumstances, and aims at providing a three-dimensional ferroelectric capacitor used in FeRAM as is capable of compensating for a decrease in the amount of polarization due to miniaturization of devices by having the directions (orientation) of crystallization of a ferroelectric crystalline film aligned in an isotropic direction so that the surface area of a crystalline film is expanded, and a method for manufacturing thereof as well as a semiconductor memory device using the three-dimensional ferroelectric capacitor.

SUMMARY OF THE INVENTION

A three-dimensional ferroelectric capacitor according to the present invention is a ferroelectric capacitor including a lower electrode formed on an inter-layer dielectric film which is formed on a substrate, a ferroelectric film formed on the lower electrode, and an upper electrode formed on the ferroelectric film, in which the above ferroelectric film has a plurality of protruding parts of three-dimensional shape formed on the surface thereof so as to expand the surface area of the ferroelectric film.

According to the three-dimensional ferroelectric capacitor of the present invention, since a plurality of protruding parts of three-dimensional shape are formed on the surface of the ferroelectric film so as to expand the surface area thereof, it is possible to compensate for a decrease in the amount of polarization of the ferroelectric film due to miniaturization of devices as well as to maintain the amount of polarization that is necessary for high integration without changing ferroelectric materials.

Further, a method for manufacturing a three-dimensional ferroelectric capacitor of the present invention includes the steps of: forming a lower electrode on an inter-layer dielectric film which is formed on a substrate, forming a ferroelectric film formed on the lower electrode with a plurality of three-dimensional protruding parts on the surface thereof so as to expand the surface area of the ferroelectric film, and forming an upper electrode on the ferroelectric film with the protruding parts formed thereon.

According to the method for manufacturing the three-dimensional ferroelectric capacitor of the present invention, by employing the process of forming a plurality of protruding parts on the surface area of the ferroelectric film, it is possible to expand the surface area of the ferroelectric film so as to compensate for an decrease in the amount of polarization due to miniaturization of devices.

Further, a semiconductor memory device of the present invention includes a ferroelectric capacitor and field effect transistor element on a semiconductor substrate, and the above-mentioned ferroelectric capacitor is composed of a lower electrode formed on an inter-layer dielectric film which is formed on the above-mentioned semiconductor substrate, a ferroelectric film formed on the above-mentioned lower electrode, having a plurality of surface parts of three-dimensional shape formed thereon so as to expand the surface area, and an upper electrode formed on the above-mentioned ferroelectric film; and with the above-mentioned ferroelectric capacitor and field effect transistor element being electrically connected, information can be accumulated in the above-mentioned ferroelectric capacitor.

A semiconductor memory device according to the present invention is the one in which a ferroelectric capacitor and an field effect transistor element are electrically connected to accumulate information in the above ferroelectric capacitor, and a ferroelectric film interposed between a lower electrode and upper electrode has a plurality of protruding parts of three-dimensional shape on the surface thereof so as to expand the surface area of the ferroelectric film. Consequently, it is possible to compensate for a decrease in the amount of polarization of the ferroelectric film due to miniaturization of device elements and to improve the performance of the above-mentioned ferroelectric capacitor, and further, to obtain a high-performance semiconductor memory device.

A planar-type semiconductor memory device of the present invention is the one in which a ferroelectric capacitor section and selective transistor section are provided in parallel on a semiconductor substrate, and the above-mentioned ferroelectric capacitor section includes: a polycrystalline silicon film HSG formed on the semiconductor substrate, having a plurality of hemi-spherical grains formed on the surface thereof; an adhesive layer laminated on the above-mentioned HSG, having protruding parts to overlap the above-mentioned hemi-spherical grains; a lower electrode laminated on the above-mentioned adhesive layer, having protruding parts to overlap the above-mentioned protruding parts; a ferroelectric film laminated on the above-mentioned lower electrode, having protruding parts to overlap the above protruding parts to expand the surface area thereof; and an upper electrode formed on the ferroelectric film, with the above-mentioned ferroelectric capacitor section and selective transistor section being electrically connected, making it possible to accumulate information in the above-mentioned capacitor.

In the planar-type semiconductor memory device of the present invention, the ferroelectric capacitor and field effect transistor element are two-dimensionally disposed with being electrically connected, and the ferroelectric film constituting the ferroelectric capacitor has a plurality of hemi-spherical protruding parts formed of HSG grown on the surface part thereof so as to expand the surface area thereof. As a result, it is possible to compensate for a decrease in the amount of polarization of the ferroelectric film due to miniaturization of device elements, and furthermore, since the crystallinity and orientation of ferroelectric crystal has an isotropic property with respect to any directions of a three-dimensional shape, the performance of the above-mentioned ferroelectric capacitor can be improved, so that a high-performance planar-type semiconductor memory device can also be obtained.

A stack-type semiconductor memory device of the present invention is the one in which a selective transistor section and a ferroelectric capacitor section are formed in a stacked state on a semiconductor substrate, in which the above-mentioned ferroelectric capacitor section is composed of a polycrystalline silicon film HSG with a plurality of hemi-spherical grains formed on the surface thereof; a barrier layer laminated on the above-mentioned HSG, having protruding parts so as to overlap the above-mentioned hemi-spherical grains; an adhesive layer laminated on the above-mentioned barrier layer, having protruding parts to overlap the protruding parts of the barrier layer; a lower electrode laminated on the above-mentioned adhesive layer, having protruding parts to overlap the above-mentioned protruding parts of the adhesive layer; a ferroelectric film laminated on the above-mentioned lower electrode, having a plurality of protruding parts to overlap the protruding parts of the lower electrode so as to expand the surface area of the ferroelectric film; and an upper electrode formed on the above-mentioned ferroelectric film, with said ferroelectric capacitor section and said selective transistor section being electrically connected, making it possible to accumulate information in the above-mentioned ferroelectric capacitor section.

According to the stack-type semiconductor memory device of the present invention, in which the above-mentioned selective transistor section and ferroelectric capacitor section are formed in a stacked state, the ferroelectric film constituting the ferroelectric capacitor has a plurality of protruding parts of three-dimensional shape formed so as to expand the surface area thereof. As a result, it is possible to compensate for a decrease in the amount of polarization of the ferroelectric film due to miniaturization of device elements, and furthermore, since the crystallinity and orientation of ferroelectric crystallization has an isotropic property with respect to any directions of a three-dimensional shape, the performance of the above-mentioned ferroelectric capacitor can be improved, so that a high-performance stack-type semiconductor memory device can be obtained.

DESCRIPTION OF THE PREFERRED EMBODIMENTS

Hereinafter, embodiments of the present invention will be explained with reference to the attached drawings.

Figure 1:
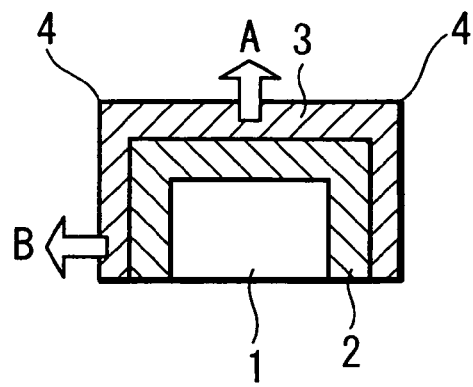
FIG. 1 is a conceptual diagram of a ferroelectric capacitor that has a three-dimensional structure.
Figure 2:
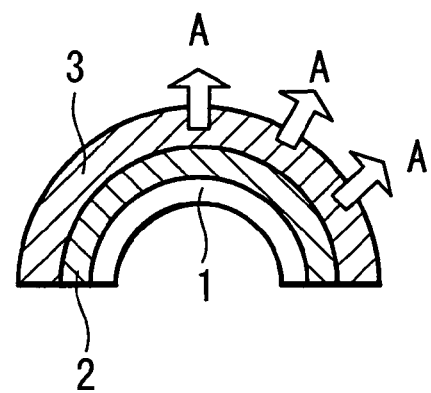
FIG. 2 is a conceptual diagram for explaining the three-dimensional structure of the ferroelectric capacitor that is an embodiment of the present invention.
Figure 3:
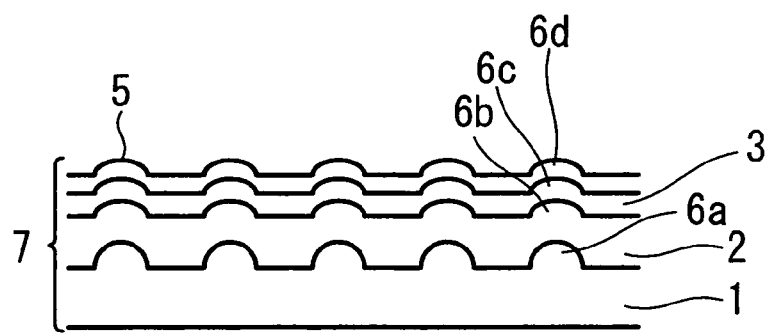
FIG. 3 is a partly cross-sectional diagram schematically showing an embodiment of the ferroelectric capacitor of the present invention.
Figure 4:
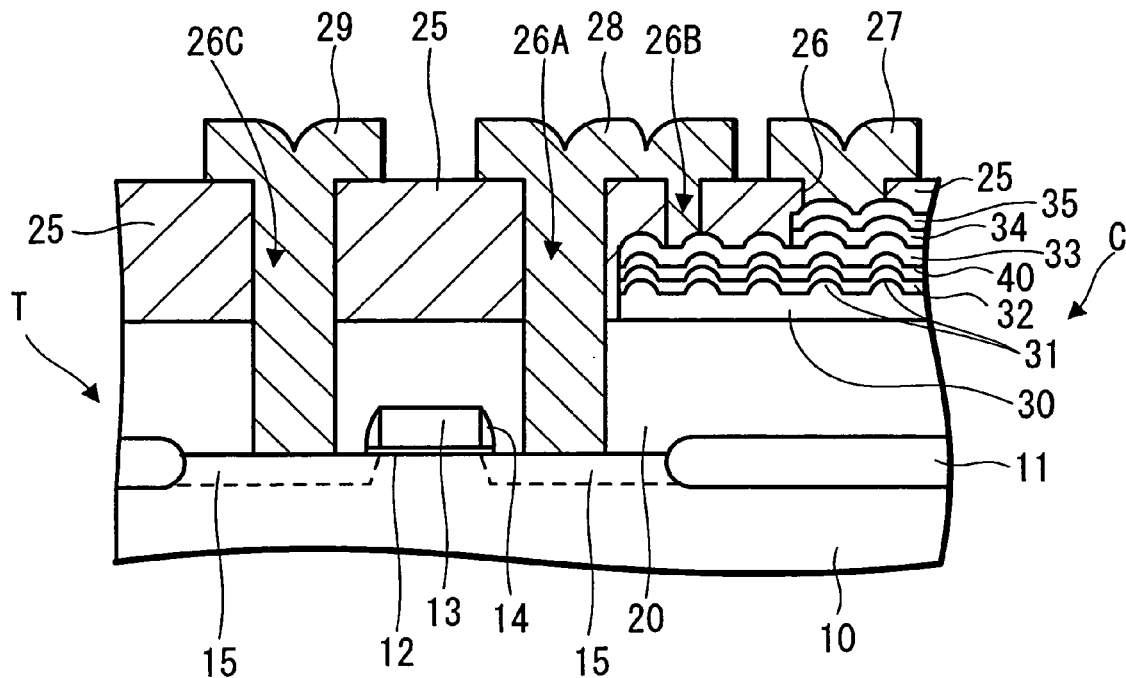
FIG. 4 is a partly cross-sectional diagram showing the structure of a planar-type FeRAM using the ferroelectric capacitor that is an embodiment of the present invention.
Figure 5:
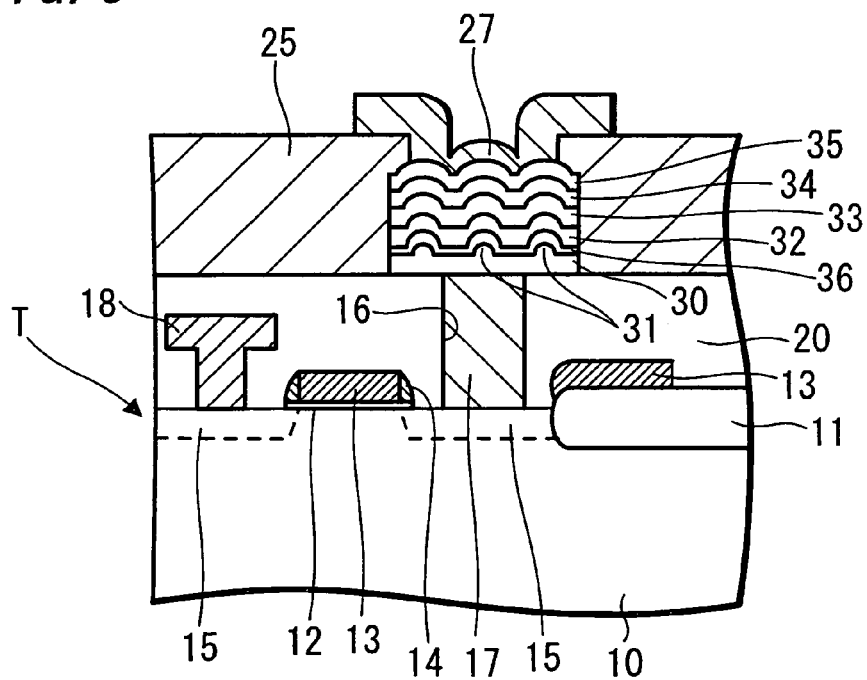
FIG. 5 is a partly cross-sectional diagram showing the structure of a stack-type FeRAM using the ferroelectric capacitor that is an embodiment of the present invention.

FIG. 1 is a conceptual diagram of a ferroelectric capacitor that has a three-dimensional structure. FIG. 2 is a conceptual diagram for explaining the three-dimensional structure of the ferroelectric capacitor that is an embodiment of the present invention. FIG. 3 is a partly cross-sectional diagram schematically showing an embodiment of the ferroelectric capacitor of the present invention, FIG. 4 is a partly cross-sectional diagram showing the structure of a planar-type semiconductor memory device using the ferroelectric capacitor that shows an embodiment of the present invention, and FIG. 5 is a partly cross-sectional diagram showing the structure of a stack-type semiconductor memory device using the ferroelectric capacitor that shows an embodiment of the present invention.

Hereinafter, embodiments of the present invention will be explained with reference to FIGS. 2 to 5.

FIG. 2 is a conceptual diagram for explaining the three-dimensional structure of the ferroelectric capacitor of the present invention and shows one protruding part. An inter-layer film 1 having a hemi-spherical shape is formed on a semiconductor substrate (not shown in the figure), and a lower electrode 2 and ferroelectric crystalline film 3 each having the same hemi-spherical shape as the inter-layer film 1 are sequentially laminated thereon.

In FIG. 2, as shown with an arrow mark A, the direction of individual hemi-spherical grains (crystallinity) shows isotropy in the vertical direction with respect to a surface regardless of the position on the surface, which makes the performance of the ferroelectric capacitor improve.

FIG. 3 shows an embodiment of the ferroelectric capacitor 7 of the present invention and is a partly cross-sectional diagram schematically showing the state in which a three-dimensional structure of hemi-spherical shape is formed in a plurality of positions on the surface of the ferroelectric crystalline film 3.

A plurality of protruding parts 6a, 6b, 6c, 6d formed respectively in the inter-layer film 1, lower electrode 2, ferroelectric layer 3, and an upper electrode 5 are formed at positions where those protruding parts are superposed on top of each other, and are formed at approximately equal intervals on the respective planes. Though, in FIG. 3, the protruding parts are disposed at approximately equal intervals, they may be formed randomly.

In order to form the hemi-spherical protruding part 6a at a plurality of positions on the surface of the inter-layer film 1, the inter-layer film 1 is formed on a semiconductor substrate with hemi-spherical protruding parts already formed thereon by means of a CVD method. The lower electrode 2 is formed on the hemi-spherical protruding part 6a to obtain the similar hemi-spherical protruding part 6b. Further, the similar protruding part 6c is formed when the ferroelectric crystalline film 3 is formed on the lower electrode 2. By forming the upper electrode 5 on the ferroelectric crystalline film 3, the ferroelectric capacitor can be obtained.

Note that, though not shown in FIG. 3, in the case where a lowermost bottom film is formed of a polycrystalline silicon film, protruding parts are HSG-grown to become a hemi-spherical shape by means of the known HSG (Hemi-spherical Grained Silicon) technology, and the inter-layer film 1, lower electrode 2, ferroelectric layer 3, and upper electrode 4 are sequentially laminated thereon to constitute the ferroelectric capacitor 7, with the protruding parts of the respective layers being formed at positions at which they are superposed on top of each other.

In addition, FIGS. 2 and 3 are conceptually explanatory diagrams, and a specific method for manufacturing the ferroelectric capacitor will be later explained.

FIG. 4 shows a partly cross-sectional view of the ferroelectric capacitor schematically showing an embodiment of the present invention, in which the ferroelectric capacitor is incorporated and used in a semiconductor memory device, particularly in FeRAM. The figure shows the so-called planar-type FeRAM, which is composed of a planar-type ferroelectric capacitor section C and selective transistor section T that are provided in parallel to each other.

Referring to the figure, a method of the present invention for manufacturing, in a ferroelectric capacitor section C, an upper electrode, ferroelectric film, and lower electrode (Pt/SrBi2Ta2O9(SBT)/Pt) constituting a planar-type ferroelectric capacitor on a poly-silicon layer 30 with protruding parts 31 in hemi-spherical shape will be explained.

By means of the known HSG (Hemi-spherical Grained Silicon) method, hemi-spherical grains (protruding parts) 31 are formed on the surface of a polycrystalline silicon layer. A SiO2 film is formed on the protruding parts 31 as an adhesive film 32 using a CVD method.

A lower electrode Pt 33 is formed on a SiO2 film 40 which is formed on the adhesive layer 32 using a sputtering method. A ferroelectric film SBT 34 is formed on the lower electrode Pt 33. In order to make the ferroelectric film SBT 34 a homogeneous film with an excellent coating property, the MOCVD method or LSMCD (Liquid Solution Misted Chemical Deposition) method may be used.

Next, the specific condition and process of forming the ferroelectric film SBT 34 using the MOCVD method will be explained.

By supplying two kinds of organic metal materials $Sr[Ta_2(OC_2H_5)_6]_2$ and $Bi(OtC_4H_9)_3$ at a rate of 4:6 under the conditions of a carburetor temperature at 140° C., 200$_{cc}$ flow quantities of carrier gas (Ar), and 200$_{cc}$ flow quantities of oxidizing reagent, it is possible to feed a gas capable of realizing a required composition into a reactor. When the above-mentioned gas is fed by setting the temperature of a substrate disposed in the reactor at 400° C. and the pressure in the reactor at 1 $T_{orr}$, an amorphous thin film of $SrBi_2Ta_2O_9$ can be grown on the substrate.

The above-mentioned vaporizing method is the so-called liquid supply method, and in place of the method, the so-called bubbling method can be employed in which carrier gas is fed into a source material filled in a material container made of stainless steel to be vaporized. In this case, in order to efficiently carry out the vaporization, it is necessary to heat a cylinder up to the same temperature or more, that is, 150° C. to 200° C. as in the above-mentioned carburetor.

In order to induce the characteristic features of the ferroelectric of $SrBi_2Ta_2O_9$, it is essential that the proportional ratio of respective elements, that is, the proportional ratio of composition thereof be strictly controlled. To this end, by using a bimetallic source $Sr[Ta_2(OC_2H_5)_6]_2$, Sr:Ta is kept constant and does not greatly fluctuate in response to the film-forming conditions.

Meanwhile, when $Bi(OtC_4H_9)_3$ is used as a Bi-source, the amount of Bi fed in the film can be controlled according to various kinds of film forming conditions.

In order to make the amorphous thin film formed as mentioned above a ferroelectric film SBT, crystallization annealing is required to perform. As a typical annealing condition, the amorphous thin film is burned in an oxygen environment at a temperature of 700° C. for approximately one hour to form the ferroelectric film SBT 34.

Next, a Pt film is formed on the ferroelectric film SBT 34 using a sputtering method to form an upper electrode 35. After forming the Pt film, the so-called recovery annealing is carried out under the same conditions as in the crystallization annealing. This annealing is carried out for preventing Pt formed by the sputtering method from infiltrating from a void at the boundary of grains of the ferroelectric film SBT to make the thickness of an effective SBT thin and lower the withstand pressure thereof.

Then, by etching at the same time three layers of the upper electrode, ferroelectric film, lower electrode (Pt/SrBi2Ta2O9 (SBT)/Pt) each having a hemi-spherical structure laminated on top of each other using the dry-etching method, a ferroelectric capacitor processed to have the required size can be obtained.

An embodiment of a semiconductor memory device that is put into use by incorporating the above-mentioned ferroelectric capacitor section C will be explained in the followings with reference to the schematic partly cross-sectional diagram of FIG. 4.

An inter-layer dielectric film 20 is formed on a semiconductor substrate 10, and an element separation region 11 is partly formed in-between. A polycrystalline silicon film (poly-silicon layer) 30 is formed on the inter-layer dielectric film 20, and HSG is grown on the surface of the polycrystalline silicon film to form hemi-spherical protruding parts 31 and obtain a poly-silicon layer in hemi-spherical shape.

An adhesive layer 32 consisting of IrHf is laminated on the polycrystalline silicon film 30 with the hemi-spherical protruding parts 31, and a lower electrode 33 consisting of Pt, ferroelectric dielectric film 34 consisting of SBT, and upper electrode 35 consisting of Pt are sequentially laminated thereon. The protruding parts of respective layers are formed at the position where the respective protruding parts are laminated on top of each other on the HSG of the polycrystalline silicon film 30 that is a base layer. The upper electrode 35 is connected to a plate line 27 through a connection hole 26 formed in a dielectric layer 25.

A selective transistor section T is adjacent to the ferroelectric capacitor section C, and a gate electrode 13 is formed on a gate dielectric film 12 which is formed on the same semiconductor substrate 10. A gate sidewall 14 is formed on the side surface of the gate electrode 13.

Impurities ion-implanted in the semiconductor substrate 10 are subjected to an activation annealing process to form a source/drain region 15 to construct a field effect transistor.

The inter-layer dielectric film 20 and dielectric layer 25 are laminated on the gate electrode 13, and connection holes 26A, 26C are respectively formed on the source and drain regions 15, 15.

The lower electrode 33 of the ferroelectric capacitor section C is electrically connected to one of the source/drain regions 15 of the selective transistor section T through a connection hole 26B, wiring 28, connection hole 26A that are formed on the dielectric layer 25. The other source/drain region 15 is connected to a bit line 29 through the connection hole 26C.

In this way, the ferroelectric capacitor section C having a planar-type ferroelectric capacitor of the present invention, together with the selective transistor section C, constitutes a planar-type semiconductor memory device.

FIG. 5 is a partly cross-sectional diagram schematically showing an embodiment of a ferroelectric capacitor of the present invention, incorporated in a semiconductor memory device to be used. The diagram shows that the ferroelectric capacitor section C and selective transistor section T are constructed such that they are laminated in a vertical direction. A ferroelectric capacitor of this case is called a stack-type ferroelectric capacitor.

Referring to the diagram, a method for manufacturing an upper electrode, ferroelectric film, and lower electrode (Pt/SrBi2Ta209(SBT)/Pt), constituting the stack-type ferroelectric capacitor on the hemi-spherical poly-silicon layer 30 in the ferroelectric capacitor C of the present invention will be explained.

Hemi-spherical grains (protruding parts) 31 are formed on the polycrystalline silicon layer 30 on the surface of a plug (tungsten or poly-silicon) layer 17 used for a stack-type cell by means of the HSG method. A barrier layer 36 is laminated on the polycrystalline silicon layer 30. The barrier layer 36 is formed by a sputtering method and is provided to prevent diffusion and reaction between the plug layer 17 and lower electrode 33.

An adhesive layer 32 consisting of IrHf is formed on the barrier layer 36 by a sputtering method. The lower electrode 33 composed by sequentially laminating Ir, IrO2, and Pt is formed on the adhesive layer 32 using a sputtering method.

The ferroelectric film SBT 34 is formed on the lower electrode 33. In order to make the ferroelectric film SBT 34 a homogeneous film with an excellent coating property, the MOCVD method is used.

Next, the specific condition and process of forming the ferroelectric film SBT 34 by the MOCVD method will be explained.

By supplying two kinds of organic metal materials $Sr[Ta_2(OC_2H_5)_6]_2$ and $Bi(OtC_4H_9)_3$ at a rate of 4:6 under the conditions of a carburetor temperature at 140° C., $200_{cc}$ flow quantities of a carrier gas (Ar), and $200_{cc}$ flow quantities of oxidizing reagent, it is possible to feed gas capable of realizing a required composition into a reactor. When the above-mentioned gas is fed by setting the temperature of a substrate disposed in the reactor at 400° C. and the pressure in the reactor at 1 $T_{orr}$, a thin amorphous film of $SrBi_2Ta_2O_9$ can be grown on the substrate.

Then, a Pt film is formed on the ferroelectric film SBT 34 by a sputtering method to form the upper electrode 35. After forming the Pt film, recovery annealing is carried out under the same conditions as in the crystallization annealing. This annealing is carried out for preventing Pt formed by the sputtering method from infiltrating from a void at the boundary of grains of the ferroelectric film SBT to make the thickness of an effective SBT thin and lower the withstand pressure thereof.

Next, by etching at the same time, three layers of the upper electrode, ferroelectric film, lower electrode (Pt/SrBi2Ta209(SBT)/Pt) each having a hemi-spherical structure laminated on top of each other by a dry-etching method, a ferroelectric capacitor processed to the required size can be obtained.

An embodiment of a semiconductor memory device that is put into use by incorporating the above-mentioned stack-type ferroelectric capacitor, particularly in the case of being used in the semiconductor memory device, will be explained in the followings with reference to the schematic partly cross-sectional diagram of FIG. 5.

The inter-layer dielectric film 20 is formed on the semiconductor substrate 10, and the element separation region 11 is partly formed in-between. With respect to the selective transistor section T, the gate electrode 13 is formed on the gate dielectric film 12 which is formed on the same semiconductor substrate 10. The gate sidewall 14 is formed on the side surface of the gate electrode 13. Impurities ion-planted in the semiconductor substrate 10 are subjected to the activation annealing process to form the source/drain region 15 to construct a field effect transistor.

A conductive material (plug layer) 17 such as polycrystalline silicon or the like is filled in a contact hole 16 penetrating the inter-layer dielectric layer 20, and one of the source/drain regions 15 of the selective transistor section T and poly-silicon layer 30 of the ferroelectric capacitor section C are electrically connected. The other source/drain region 15 is connected to a bit line 18.

In this way, the ferroelectric capacitor section C having a stack-type ferroelectric capacitor of the present invention, together with the selective transistor section T, forms a stack-type semiconductor memory device.

As have been explained so far, according to the three-dimensional ferroelectric capacitor of the present invention, since three-dimensional protruding parts are formed at a plurality of positions on the surface of the ferroelectric film to expand the surface area of the ferroelectric film, it is possible to compensate for the decrease in the amount of polarization of the ferroelectric film due to miniaturization of devices as well as to maintain the amount of polarization that is necessary for high integration without changing ferroelectric materials.

Further, according to the method for manufacturing the three-dimensional ferroelectric capacitor of the present invention, since the process of forming three-dimensional protruding parts at a plurality of positions on the surface of the ferroelectric film is employed, it is possible to expand the surface area of the ferroelectric film to compensate for the decrease in the amount of polarization of the ferroelectric film due to miniaturization of devices.

Further, in the semiconductor memory device of the present invention, in which the ferroelectric capacitor and field effect transistor element are electrically connected and information can be accumulated in the above-mentioned ferroelectric capacitor, the ferroelectric film interposed between the lower electrode and upper electrode constituting the above-mentioned ferroelectric capacitor is formed such that the three-dimensional protruding parts are provided at a plurality of positions thereon to expand the surface area. Accordingly, it is possible to compensate for the decrease in the amount of polarization of the ferroelectric film due to miniaturization of devices and to improve the performance of the above-mentioned ferroelectric capacitor, and as a result, a high-performance semiconductor memory device can be obtained.

In the planar-type semiconductor memory device of the present invention in which the ferroelectric capacitor and field effect transistor element are electrically connected to be disposed two-dimensionally, the ferroelectric film constituting the ferroelectric capacitor has hemi-spherical protruding parts formed by the HSG growth at a plurality of positions on the surface thereof so as to expand the surface area thereof. Accordingly, it is possible to compensate for the decrease in the amount of polarization of the ferroelectric film due to miniaturization of device elements, and furthermore, since the crystallinity and orientation of ferroelectric crystallization has an isotropic property in any directions of the three-dimensional shape, it is possible to improve the performance of the above-mentioned ferroelectric capacitor, and as a result, the high-performance planar-type semiconductor memory device can be obtained.

Furthermore, in the stack-type semiconductor memory device of the present invention, in which the above-mentioned selective transistor section and ferroelectric capacitor section are constructed in a stacked state, the ferroelectric film constituting the ferroelectric capacitor has three-dimensional protruding parts formed at a plurality of positions to expand the surface area thereof. Accordingly, it is possible to compensate for the decrease in the amount of polarization of the ferroelectric film due to miniaturization of device elements, and furthermore, since the crystallinity and orientation of ferroelectric crystallization has an isotropic property in any directions of a three-dimensional shape, it is possible to improve the performance of the above-mentioned ferroelectric capacitor, and as a result, a high-performance stack-type semiconductor memory device can be obtained.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A three-dimensional ferroelectric capacitor comprising:
   a lower electrode formed on an inter-layer dielectric film which is formed on a substrate,
   a ferroelectric film formed on said lower electrode, and
   an upper electrode formed on said ferroelectric film, wherein said ferroelectric film has a plurality of hemi-spherically shaped three-dimensional protruding parts formed on a surface thereof to expand the surface area of the ferroelectric film, said upper electrode having a plurality of hemi-spherically shaped three-dimensional protruding parts formed on a surface of said upper electrode that is distal from said ferroelectric film surface and that overlap said protruding parts of said ferroelectric film, and said ferroelectric film has isotropy with respect to the direction of crystallization and has a continuous and homogeneous crystal structure.

2. A method for manufacturing a three-dimensional ferroelectric capacitor comprising the steps of:
   forming a lower electrode on an inter-layer dielectric film which is formed on a substrate,
   forming a plurality of hemi-spherically shaped three-dimensional protruding parts on a surface of a ferroelectric film formed on said lower electrode to expand the surface area of the ferroelectric film, said ferroelectric film having isotropy with respect to the direction of crystallization and having a continuous and homogeneous crystal structure, and
   forming an upper electrode on the ferroelectric film where said protruding parts are formed, said upper electrode having a plurality of hemi-spherically shaped three-dimensional protruding parts formed on a surface of said upper electrode that is distal from said ferroelectric film surface and that overlap said protruding parts of said ferroelectric film.

3. A method for manufacturing a three-dimensional ferroelectric capacitor according to claim 2, wherein the step of forming the protruding parts to expand the surface area of said ferroelectric film includes the HSG (Hemispherical Grained Silicon) growth step to form hemispherical grains on a polycrystalline silicon film.

4. A semiconductor memory device comprising a ferroelectric capacitor and a field effect transistor element on a semiconductor substrate, wherein
   said ferroelectric capacitor includes a lower electrode formed on an inter-layer dielectric film which is formed on said semiconductor substrate, a ferroelectric film formed on said lower electrode, having a plurality of hemi-spherically shaped three-dimensional protruding parts to enlarge the surface area of the ferroelectric film, and an upper electrode formed on said ferroelectric film, said upper electrode having a plurality of hemi-spherically shaped three-dimensional protruding parts formed on a surface of said upper electrode that is distal from said ferroelectric film surface and that overlap said protruding parts of said ferroelectric film;
   said ferroelectric film has isotropy with respect to the direction of crystallization and has a continuous and homogeneous crystal structure; and
   said ferroelectric capacitor and said field effect transistor element are electrically connected to enable information to be accumulated in said ferroelectric capacitor.

5. A planer-type semiconductor memory device comprising a ferroelectric capacitor section and a selective transistor section that are provided in parallel on a semiconductor substrate, wherein
   said ferroelectric capacitor section includes a polycrystalline silicon film HSG provided on the semiconductor substrate, in which a plurality of hemi-spherical grains are formed on the surface thereof, an adhesive layer laminated on said HSG, having hemi-spherically shaped protruding parts formed to overlap said hemi-spherical grains, a lower electrode laminated on said adhesive layer, having hemi-spherically shaped protruding parts formed on a surface of said lower electrode that is distal from said adhesive layer and that overlap said hemi-spherically shaped protruding parts of said adhesive layer, a ferroelectric film laminated on said lower electrode, having a plurality of hemi-spherically shaped protruding parts formed on a surface of said ferroelectric layer that is distal from said lower electrode and that overlap the hemi-spherically shaped protruding parts of said lower electrode and expanding the surface area thereof, and an upper electrode formed on said ferroelectric film, having hemi-spherically shaped protruding parts formed on a surface of said upper electrode that is distal from said ferroelectric film surface and that overlap said hemi-spherically shaped protruding parts of said ferroelectric film;
   said ferroelectric film has isotropy with respect to the direction of crystallization and has a continuous and homogeneous crystal structure; and
   said ferroelectric capacitor section and said selective transistor section are electrically connected to enable information to be accumulated in said ferroelectric capacitor section.

6. A planer-type semiconductor memory device according to claim 5, wherein said upper electrode is connected to a plate line, said lower electrode is electrically connected to one of source/drain regions of an field effect transistor element, and the other source/drain region of said field effect transistor element is electrically connected to a bit line, so that said ferroelectric capacitor and said field effect transistor element are two-dimensionally disposed.

7. A stack-type semiconductor memory device comprising a selective transistor section and a ferroelectric capacitor section that are formed in a stacked state on a semiconductor substrate, wherein said ferroelectric capacitor section includes a polycrystalline silicon film HSG with a plurality of hemi-spherical grains formed on the surface thereof, a baffler layer laminated on said HSG, having hemi-spherically shaped protruding parts formed to overlap said hemi-spherical grains, an adhesive layer laminated on said barrier layer, having hemi-spherically shaped protruding parts formed on a surface of said adhesive layer that is distal from said barrier layer and that overlap the hemi-spherically shaped protruding parts of the baffler layer, a lower electrode laminated on said adhesive layer, having hemi-spherically shaped protruding parts formed on a surface of said lower electrode that is distal from said adhesive layer and that overlap said hemi-spherically shaped protruding parts of the adhesive layer, a ferroelectric film laminated on said lower electrode, having a plurality of hemi-spherically shaped protruding parts formed on a surface of said ferroelectric layer that is distal from said lower electrode and that overlap the hemi-spherically shaped protruding parts of the lower electrode and expanding the surface area thereof, and an upper electrode formed on said ferroelectric film, having hemi-spherically shaped protruding parts on a formed on a surface of said upper electrode that is distal from said ferroelectric film and that to overlap said hemi-spherically shaped protruding parts of said ferroelectric film;

said ferroelectric film has isotropy with respect to the direction of crystallization and has a continuous and homogeneous crystal structure; and said ferroelectric capacitor section and said selective transistor section are electrically connected to enable information to be accumulated in said ferroelectric capacitor section.

8. A stack-type semiconductor memory device according to claim 7, wherein said upper electrode of said ferroelectric capacitor is connected to a plate line, the polycrystalline silicon film HSG with said hemi-spherical grains formed thereon is electrically connected to one of source/drain regions of a field effect transistor element through a conductive plug provided to penetrate a dielectric layer, and the other source/drain region of said field effect transistor element is electrically connected to a bit line, so that said ferroelectric capacitor and said field effect transistor element are disposed in a stacked state.

* * * * *